United States Patent
Chen et al.

(10) Patent No.: US 10,930,661 B2
(45) Date of Patent: Feb. 23, 2021

(54) EMBEDDED PAD STRUCTURES OF THREE-DIMENSIONAL MEMORY DEVICES AND FABRICATION METHODS THEREOF

(71) Applicant: Yangtze Memory Technologies Co., Ltd., Hubei (CN)

(72) Inventors: Jun Chen, Hubei (CN); Zhiliang Xia, Hubei (CN); Li Hong Xiao, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 16 days.

(21) Appl. No.: 16/163,274

(22) Filed: Oct. 17, 2018

(65) Prior Publication Data

US 2020/0058669 A1 Feb. 20, 2020

Related U.S. Application Data

(63) Continuation of application No. PCT/CN2018/100852, filed on Aug. 16, 2018.

(51) Int. Cl.
*H01L 27/11573* (2017.01)
*H01L 27/1157* (2017.01)
*H01L 27/11582* (2017.01)

(52) U.S. Cl.
CPC .... *H01L 27/11573* (2013.01); *H01L 27/1157* (2013.01); *H01L 27/11582* (2013.01)

(58) Field of Classification Search
CPC .......... H01L 27/11573; H01L 27/1157; H01L 27/11582

(Continued)

(56) References Cited

U.S. PATENT DOCUMENTS 9,305,934 B1 * 4/2016 Ding ................ H01L 27/11573
9,449,983 B2 * 9/2016 Yada ................ H01L 21/02164
(Continued)

FOREIGN PATENT DOCUMENTS

CN 104769714 A 7/2015
CN 105261617 A 1/2016
(Continued)

OTHER PUBLICATIONS

Chen, John Y., "CMOS Devices and Technology for VLSI," Prentice-Hall, Inc., Englewood Cliffs, N.J., 1990, p. 149.
(Continued)

*Primary Examiner* — Dzung Tran
(74) *Attorney, Agent, or Firm* — Sterne, Kessler, Goldstein & Fox P.L.L.C.

(57) ABSTRACT

Embodiments of 3D memory devices and fabricating methods thereof are disclosed. The device comprises an array device semiconductor structure comprising an array interconnect layer disposed on the alternating conductor/dielectric stack and including a first interconnect structure. The device further comprises a peripheral device semiconductor structure comprising a peripheral interconnect layer disposed on a peripheral device and including a second interconnect structure. The device further comprises a pad embedded in the array device semiconductor structure or the peripheral interconnect layer, and a pad opening exposing a surface of the pad. The array interconnect layer is bonded with the peripheral interconnect layer, and the pad is electrically connected with the peripheral device through the first interconnect structure or the second interconnect structure.

8 Claims, 10 Drawing Sheets

(58) Field of Classification Search
USPC .......................................................... 257/314
See application file for complete search history.

(56) References Cited

U.S. PATENT DOCUMENTS

| | | | |
|---|---|---|---|
| 9,997,530 | B2 | 6/2018 | Yon et al. |
| 10,038,026 | B2 | 7/2018 | Huang et al. |
| 10,276,619 | B2 | 4/2019 | Kao et al. |
| 2007/0145367 | A1 | 6/2007 | Chen et al. |
| 2010/0102453 | A1 | 4/2010 | Tseng et al. |
| 2010/0109065 | A1 | 5/2010 | Oh et al. |
| 2013/0130468 | A1* | 5/2013 | Higashitani ......... H01L 29/7926 438/382 |
| 2015/0228621 | A1 | 8/2015 | Kumar et al. |
| 2016/0379962 | A1* | 12/2016 | Huang ................ H01L 27/1464 257/459 |
| 2017/0179152 | A1* | 6/2017 | Toyama ............ H01L 27/11524 |
| 2017/0236746 | A1 | 8/2017 | Yu et al. |
| 2017/0256558 | A1* | 9/2017 | Zhang ................ H01L 27/1157 |
| 2018/0040553 | A1 | 2/2018 | Tak et al. |
| 2018/0315769 | A1 | 11/2018 | Huo et al. |

FOREIGN PATENT DOCUMENTS

| | | |
|---|---|---|
| CN | 105321952 A | 2/2016 |
| CN | 106298718 A | 1/2017 |
| CN | 106960835 A | 7/2017 |
| CN | 107680971 A | 2/2018 |

OTHER PUBLICATIONS

International Search Report and Written Opinion of the International Searching Authority directed to related International Patent Application No. PCT/CN2018/100852, dated May 15, 2019; 10 pages.

* cited by examiner

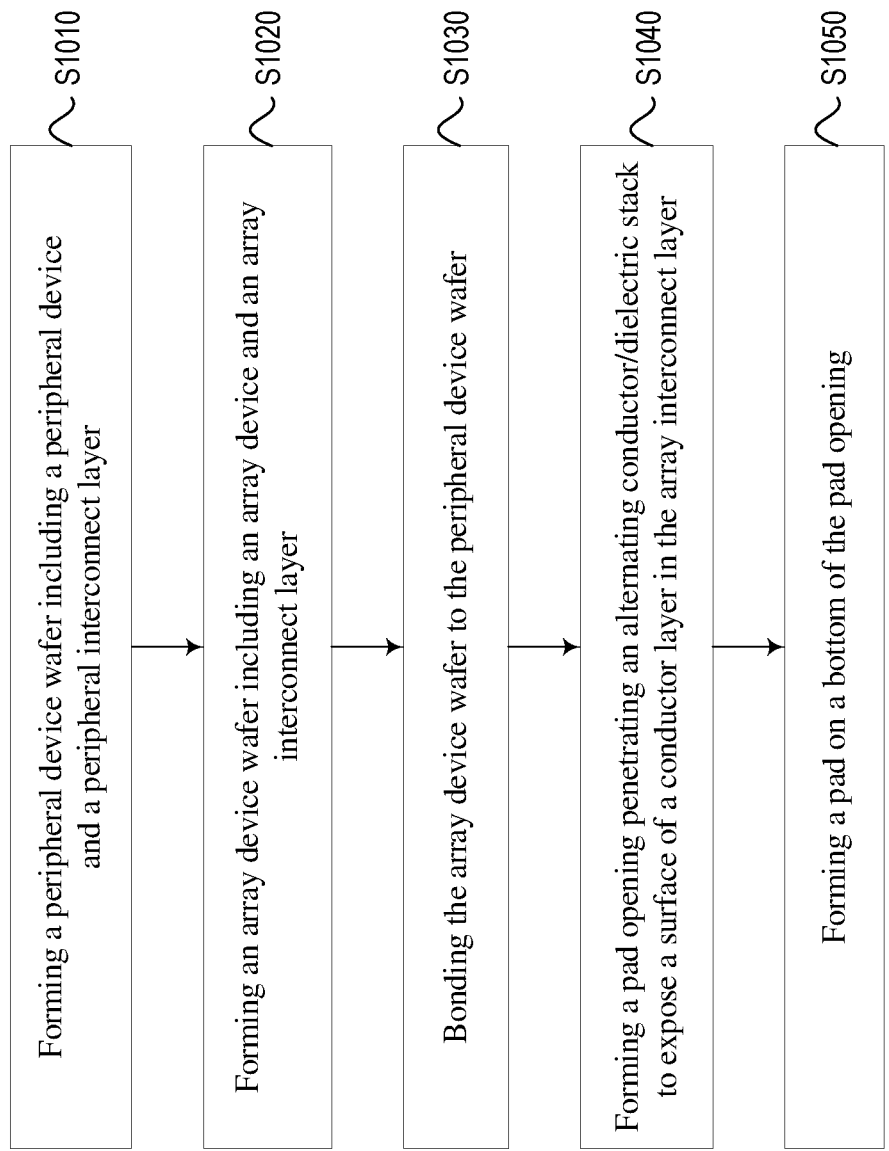

EMBEDDED PAD STRUCTURES OF THREE-DIMENSIONAL MEMORY DEVICES AND FABRICATION METHODS THEREOF

CROSS-REFERENCE TO RELATED APPLICATIONS

This application claims priority to PCT Application No. PCT/CN2018/100852, filed on Aug. 16, 2018, which is incorporated herein by reference in their entireties.

TECHNICAL FIELD

The present disclosure generally relates to the field of semiconductor technology, and more particularly, to embedded pad structures of three-dimensional (3D) memory devices and fabricating methods thereof.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

In a conventional Periphery Under Cell (PUC) structure of 3D memory devices, a pad and the peripheral device may be relatively far apart from each other. For example, in a monolithic 3D memory device, the periphery circuit and the memory cell array are on a same wafer, and the periphery circuit is arranged under the memory cell array, while the pads are arranged above the memory cell array. As another example, the periphery circuit and the memory cell array are on different wafers. The wafers are bonded together, such that the periphery circuit is arranged under the memory cell array, and the pads are arranged above the memory cell array. In both cases, the resistance and capacitance between the pads and the peripheral device are relatively high. When noise factors increased, signals through the pads would be distorted and therefore fail in signal integrity during transmit.

BRIEF SUMMARY

Embodiments of embedded pad structures of 3D memory devices and fabrication methods thereof are disclosed herein.

One aspect of the present disclosure provides a 3D memory device comprising an array device semiconductor structure comprising: an alternating conductor/dielectric stack disposed on a semiconductor layer, and an array interconnect layer disposed on the alternating conductor/dielectric stack and including at least one first interconnect structure. The 3D memory device further comprises a peripheral device semiconductor structure comprising: at least one peripheral device disposed on a substrate, and a peripheral interconnect layer disposed on the at least one peripheral device and including at least one second interconnect structure; at least one pad embedded in the array device semiconductor structure or the peripheral interconnect layer. The 3D memory device further comprises a pad opening exposing a surface of the at least one pad. The array interconnect layer is bonded with the peripheral interconnect layer, and the at least one pad is electrically connected with at least one peripheral device through the at least one first interconnect structure or the at least one second interconnect structure.

In some embodiments, the at least one pad is embedded in the peripheral interconnect layer; the pad opening extends through the array device semiconductor structure and extends into the peripheral interconnect layer; and the at least one pad is electrically connected with the at least one peripheral device through at least one second interconnect structure.

In some embodiments, the at least one pad is embedded in the array interconnect layer; a depth of the pad opening is larger than a thickness of the alternating conductor/dielectric stack; and the at least one pad is electrically connected with at least one peripheral device through the at least one first interconnect structure and the at least one second interconnect structure.

In some embodiments, the at least one pad is embedded in a dielectric layer and is sandwiched between a first lateral surface coplanar with a top surface of the alternating conductor/dielectric stack and a second lateral surface coplanar with a bottom surface of the alternating conductor/dielectric stack; a depth of the pad opening is less than a thickness of the alternating conductor/dielectric stack; and the at least one pad is electrically connected with at least one peripheral device through at least one pad interconnect structure in the dielectric layer, the at least one first interconnect structure, and the at least one second interconnect structure.

In some embodiments, the at least one pad is located at a side edge of the alternating conductor/dielectric stack and close to a staircase structure region.

In some embodiments, the at least one pad is located in a dielectric layer in the array interconnect layer; and the pad opening extends through the alternating conductor/dielectric stack.

In some embodiments, the at least one pad is located in a dielectric structure that extends through the alternating conductor/dielectric stack.

In some embodiments, the dielectric structure is isolated from the alternating conductor/dielectric stack by a barrier structure.

Another aspect of the present disclosure provides a method for forming a 3D memory device, comprising: forming an array device semiconductor structure comprising: an alternating conductor/dielectric stack disposed on a semiconductor layer, and an array interconnect layer disposed on the alternating conductor/dielectric stack and including at least one first interconnect structure; forming a peripheral device semiconductor structure comprising: at least one peripheral device disposed on a substrate, and a peripheral interconnect layer disposed on the at least one peripheral device and including at least one second interconnect structure and at least one pad, the at least one pad being electrically connected with the at least one peripheral device through the at least one second interconnect structure; bonding the array interconnect layer to the peripheral interconnect layer, such that the at least one first interconnect structure is joined with the at least one second interconnect structure; and forming a pad opening exposing a surface of the at least one pad.

In some embodiments, the method further comprises: before bonding the array interconnect layer to the peripheral interconnect layer, forming the at least one pad in the peripheral interconnect layer and in contact with the at least one second interconnect structure; and after bonding the array interconnect layer to the peripheral interconnect layer, forming the pad opening penetrating the array device semiconductor structure and extending into the peripheral interconnect layer to expose a surface of the at least one pad.

Another aspect of the present disclosure provides a method for forming a 3D memory device, comprising: forming an array device semiconductor structure comprising: an alternating conductor/dielectric stack disposed on a semiconductor layer, and an array interconnect layer disposed on the alternating conductor/dielectric stack and including at least one first interconnect structure and at least one pad; forming a peripheral device semiconductor structure comprising: at least one peripheral device disposed on a substrate, and a peripheral interconnect layer disposed on the at least one peripheral device and including at least one second interconnect structure; bonding the array interconnect layer to the peripheral interconnect layer, such that the at least one first interconnect structure is joined with the at least one second interconnect structure, and the at least one pad is electrically connected with the at least one peripheral device through the at least one of first interconnect structure and the at least one second interconnect structure; and forming a pad opening exposing a surface of the at least one pad.

In some embodiments, the method further comprises: before bonding the array interconnect layer to the peripheral interconnect layer, forming the at least one pad in the array interconnect layer and in contact with the at least one first interconnect structure; and after bonding the array interconnect layer to the peripheral interconnect layer, forming the pad opening penetrating the semiconductor layer and extending into the array interconnect layer to expose a surface of the at least one pad.

In some embodiments, the method further comprises: before bonding the array interconnect layer to the peripheral interconnect layer, forming a barrier structure to form a through array contact region in the array device semiconductor; and after bonding the array interconnect layer to the peripheral interconnect layer, forming the pad opening penetrating the through array contact region and extending into the array interconnect layer.

In some embodiments, the method further comprises: before bonding the array interconnect layer to the peripheral interconnect layer, forming a dielectric structure penetrating the alternating conductor/dielectric stack; and after bonding the array interconnect layer to the peripheral interconnect layer, forming the pad opening penetrating the dielectric structure region and extending into the array interconnect layer.

In some embodiments, the method further comprises: forming the pad opening at a side edge of the alternating conductor/dielectric stack and close to a staircase structure region of the alternating conductor/dielectric stack.

Another aspect of the present disclosure provides a method for forming a 3D memory device, comprising: forming an array device semiconductor structure comprising: an alternating conductor/dielectric stack disposed on a semiconductor layer, an array interconnect layer disposed on the alternating conductor/dielectric stack and including at least one first interconnect structure; forming a peripheral device semiconductor structure, the peripheral device semiconductor structure comprising: at least one peripheral device disposed on a substrate, and a peripheral interconnect layer disposed on the at least one peripheral devices and including at least one second interconnect structure; bonding the array interconnect layer to the peripheral interconnect layer, such that at least one first interconnect structure is joined with at least one second interconnect structure; forming a pad opening exposing a surface of the at least one first interconnect structure or a surface of the at least one second interconnect structure; and forming a pad at a bottom of the pad, such that the pad is electrically connected to the at least one peripheral device through the at least one first interconnect structure or the at least one second interconnect structure.

In some embodiments, the method further comprises: after bonding the array interconnect layer to the peripheral interconnect layer, forming the pad opening penetrating the array device semiconductor structure and extending into the peripheral interconnect layer to expose a surface of the at least one second interconnect structure; and forming the pad at a bottom of the pad opening in the peripheral interconnect layer and in contact with the at least one second interconnect structure.

In some embodiments, the method further comprises: after bonding the array interconnect layer to the peripheral interconnect layer, forming the pad opening penetrating the semiconductor layer and extending into the array interconnect layer to expose a surface of the at least one first interconnect structure; and forming the pad at a bottom of the pad opening in the array interconnect layer and in contact with the at least one first interconnect structure.

In some embodiments, the method further comprises: before bonding the array interconnect layer to the peripheral interconnect layer, forming a barrier structure to form a through array contact region array device semiconductor; and after bonding the array interconnect layer to the peripheral interconnect layer, forming the pad opening penetrating the through array contact region and extending into the array interconnect layer to expose a surface of the at least one first interconnect structure; and forming the pad at a bottom of the pad opening in the array interconnect layer and in contact with the at least one first interconnect structure.

In some embodiments, the method further comprises: before bonding the array interconnect layer to the peripheral interconnect layer, forming a dielectric structure penetrating the alternating conductor/dielectric stack; after bonding the array interconnect layer to the peripheral interconnect layer, forming the pad opening penetrating the dielectric structure region and extending into the array interconnect layer to expose a surface of the at least one first interconnect structure; and forming the pad at a bottom of the pad opening in the array interconnect layer and in contact with the at least one first interconnect structure.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 10 illustrates another exemplary fabrication process for forming a 3D memory device as shown in FIG. 8 in accordance with some other embodiments of the present disclosure.

Figure 1:
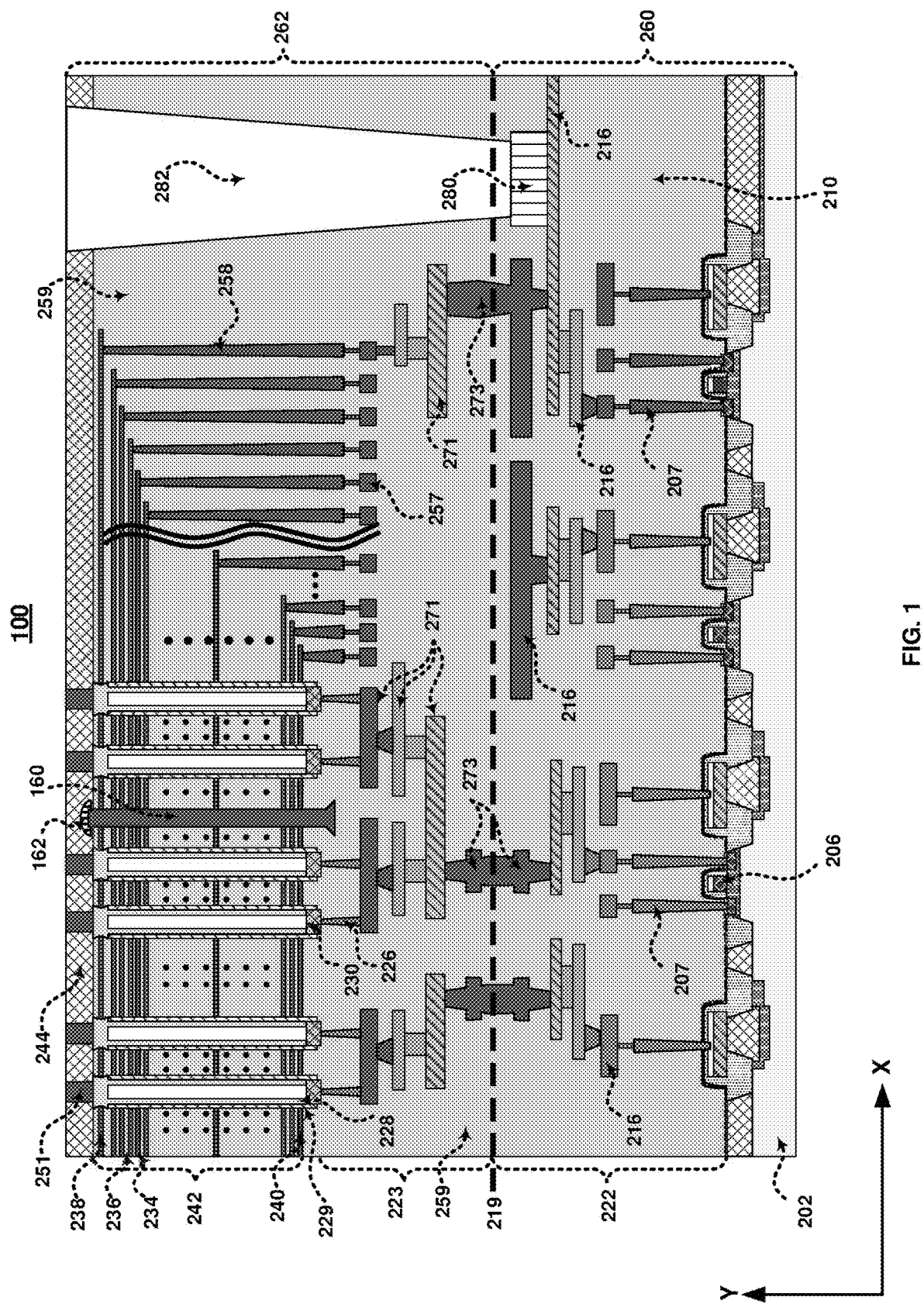
FIG. 1 illustrates a cross-section of an exemplary 3D memory device 100 according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

Various embodiments in accordance with the present disclosure provide fabricating methods and corresponding formed 3D memory devices with smaller die size, higher device density, and improved performance compared with other 3D memory devices. By embedding one or more pads into a peripheral device wafer or an array device wafer, a distance between one or more pads and the peripheral circuit in the peripheral device wafer is shorten. As such, the resistance and capacitance between the pads and the peripheral device can be significantly reduced, thereby increasing accuracy of signal transmission through the one or more pads.

FIG. 1 illustrates a cross-section of an exemplary 3D memory device 100 according to some embodiments of the present disclosure. 3D memory device 100 can include a substrate 202, which can include silicon (e.g., single crystalline silicon), silicon germanium (SiGe), gallium arsenide (GaAs), germanium (Ge), silicon on insulator (SOI) or any other suitable materials.

3D memory device 100 can include a peripheral device on substrate 202. The peripheral device can be formed "on" substrate 202, in which the entirety or part of the peripheral device is formed in substrate 202 (e.g., below the top surface of substrate 202) and/or directly on substrate 202. The peripheral device can include a plurality of transistors 206 formed on substrate 202. An isolation region and a doped region (e.g., a source region or a drain region of transistor 206) can be formed in substrate 202 as well.

In some embodiments, the peripheral device can include any suitable digital, analog, and/or mixed-signal peripheral devices used for facilitating the operation of 3D memory device 100. For example, the peripheral device can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). In some embodiments, the peripheral device is formed on substrate 202 using complementary metal-oxide-semiconductor (CMOS) technology (also known as a "CMOS chip").

3D memory device 100 can include a peripheral interconnect layer 222 above transistors 206 to transfer electrical signals to and from transistors 206. Peripheral interconnect layer 222 can include one or more contacts, such as contacts 207, and one or more interconnect conductor layers, such as conductor layers 216, each including one or more interconnect lines and/or vias. As used herein, the term "contact" can broadly include any suitable types of interconnects, such as middle-end-of-line (MEOL) interconnects and back-end-of-line (BEOL) interconnects, including vertical interconnect accesses (e.g., vias) and lateral lines (e.g., interconnect lines). Peripheral interconnect layer 222 can further include one or more interlayer dielectric (ILD) layers, such as dielectric layer 210. That is, peripheral interconnect layer 222 can include conductor layers 216 in dielectric layer 210. The contact and conductor layers in peripheral interconnect layer 222 can include conductor materials including, but not limited to, tungsten (W), cobalt (Co), copper (Cu), aluminum (Al), silicides, or any combination thereof. The dielectric layers in peripheral interconnect layer 222 can include dielectric materials including, but not limited to, silicon oxide, silicon nitride, silicon oxynitride, doped silicon oxide, or any combination thereof.

3D memory device 100 can include a memory array device above the peripheral device. It is noted that x and y axes are added in FIG. 1 to further illustrate the spatial relationship of the components in 3D memory device 100. Substrate 202 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 100) is determined relative to the substrate of the semiconductor device (e.g., substrate 202) in the y-direction (the vertical direction or thickness direction) when the substrate is positioned in the lowest plane of the semiconductor device in the y-direction. The same notion for describing spatial relationship is applied throughout the present disclosure.

In some embodiments, 3D memory device 100 is a NAND Flash memory device in which memory cells are provided in the form of an array of NAND strings 230 extending vertically above substrate 202. The array device can include a plurality of NAND strings 230 that extend through a plurality of conductor layer 234 and dielectric layer 236 pairs. The plurality of conductor/dielectric layer pairs are also referred to herein as an "alternating conductor/dielectric stack" 242. Conductor layers 234 and dielectric layers 236 in alternating conductor/dielectric stack 242 alternate in the vertical direction. In other words, except the ones at the top or bottom of alternating conductor/dielectric stack, each conductor layer 234 can be sandwiched by two dielectric layers 236 on both sides, and each dielectric layer 236 can be sandwiched by two conductor layers 234 on both sides. Conductor layers 234 can each have the same thickness or have different thicknesses. Similarly, dielectric layers 236 can each have the same thickness or have different thicknesses. In some embodiments, alternating conductor/dielectric stack 242 includes more conductor layers or more dielectric layers with different materials and/or thicknesses than the conductor/dielectric layer pair. Conductor layers 234 can include conductor materials including, but not limited to, W, Co, Cu, Al, doped silicon, silicides, or any combination thereof. Dielectric layers 236 can include dielectric materials including, but not limited to, silicon oxide, silicon nitride, silicon oxynitride, or any combination thereof.

As shown in FIG. 1, each NAND string 230 can include a semiconductor channel 228 and a dielectric layer 229 (also known as "memory film"). In some embodiments, semiconductor channel 228 includes silicon, such as amorphous silicon, polysilicon, or single crystalline silicon. In some embodiments, dielectric layer 229 is a composite layer including a tunneling layer, a storage layer (also known as "charge trap/storage layer"), and a blocking layer. Each NAND string 230 can have a cylinder shape (e.g., a pillar shape). Semiconductor channel 228, the tunneling layer, the storage layer, and the blocking layer are arranged along a direction from the center toward the outer surface of the pillar in this order, according to some embodiments. The tunneling layer can include silicon oxide, silicon nitride, or any combination thereof. The blocking layer can include silicon oxide, silicon nitride, high dielectric constant (high-k) dielectrics, or any combination thereof. The storage layer can include silicon nitride, silicon oxynitride, silicon, or any combination thereof. In some embodiments, dielectric layer 229 includes ONO dielectrics (e.g., a tunneling layer including silicon oxide, a storage layer including silicon nitride, and a blocking layer including silicon oxide).

In some embodiments, NAND strings 230 further include a plurality of control gates (each being part of a word line) for NAND strings 230. Each conductor layer 234 in alternating conductor/dielectric stack 242 can act as a control gate for each memory cell of NAND string 230. As shown in FIG. 1, NAND string 230 can include a selective gate 238 (e.g., a source selective gate) at an upper end of NAND string 230. NAND string 230 can also include another selective gate 240 (e.g., a drain selective gate) at a lower end of NAND string 230. As used herein, the "upper end" of a component (e.g., NAND string 230) is the end further away from substrate 202 in the y-direction, and the "lower end" of the component (e.g., NAND string 230) is the end closer to substrate 202 in the y-direction. As shown in FIG. 1, for each NAND string 230, source selective gate 238 can be above drain selective gate 240. In some embodiments, selective gate 238 and selective gate 240 include conductor materials including, but not limited to, W, Co, Cu, Al, doped silicon, silicides, or any combination thereof.

In some embodiments, 3D memory device 100 includes an epitaxial layer 251 on an upper end of semiconductor channel 228 of NAND string 230. Epitaxial layer 251 can include a semiconductor material, such as silicon. Epitaxial layer 251 can be epitaxially grown from a semiconductor layer 244. For example, semiconductor layer 244 can be a single crystalline silicon layer, and epitaxial layer 251 can be a single crystalline silicon layer epitaxially grown from the single crystalline silicon layer. Semiconductor layer 244 can be un-doped, partially doped (in the thickness direction and/or the width direction), or fully doped by p-type or n-type dopants. For each NAND string 230, epitaxial layer 251 is referred to herein as an "epitaxial plug." Epitaxial plug 251 at the upper end of each NAND string 230 can contact both semiconductor channel 228 and a doped region of semiconductor layer 244. Epitaxial plug 251 can function as the channel of a corresponding selective gate 238 at the upper end of NAND string 230. As shown in FIG. 1, semiconductor layer 244 can include two lateral surfaces (e.g., a top surface and a bottom surface). Each NAND string 230 is in contact with the bottom surface of semiconductor layer 244, and a BEOL interconnect layer (not shown in figures) can be in contact with the top surface of semiconductor layer 244, according to some embodiments.

In some embodiments, the array device further includes multiple word line contacts 258 in a staircase structure region. Word line contacts 258 can extend vertically within a dielectric layer 259. Each word line contact 258 can have an end (e.g., the upper end) in contact with a corresponding conductor layer 234 in alternating conductor/dielectric stack 242 to individually address a corresponding word line of the array device. In some embodiments, each word line contact 258 is below a corresponding word line 234. Word line contacts 258 can be contact holes and/or contact trenches (e.g., formed by a wet etch process or a dry etch process) filled with a conductor (e.g., W). In some embodiments, filling the contact holes and/or contact trenches includes depositing a barrier layer, an adhesion layer, and/or a seed layer before depositing the conductor.

In some embodiments, the array device further includes semiconductor layer 244 on the upper end of each NAND string 230. Semiconductor layer 244 can be a thinned substrate on which the array device is formed. In some embodiments, semiconductor layer 244 includes a single crystalline silicon, in which semiconductor layer 244 can be referred to as a "single crystalline silicon layer." In some embodiments, semiconductor layer 244 can include SiGe, GaAs, Ge, or any other suitable materials. Semiconductor layer 244 can also include doped region functioning as an array common source for NAND strings 230, and an isolation region extending across an entire thickness or part of the thickness of semiconductor layer 244.

In some embodiments, the array device further includes one or more gate line slits 160. Each gate line slit 160 can vertically penetrate through the alternating dielectric stack, and horizontally extend in a straight line between two arrays of NAND string 230 and along a direction that is appendicular to both x-direction and y-direction as shown in FIG. 1. In some embodiments, each gate line slit 160 can include a metal wall sandwiched by two dielectric sidewalls. For example, the metal wall can be a tungsten wall, and the dielectric sidewalls can be silicon oxide layers. A top of the metal wall of gate line slit 160 is in contact with a doped region 162 in semiconductor layer 244 which is functioned as a common source region.

As shown in FIG. 1, 3D memory device 100 can include an array interconnect layer 223 above and in contact with peripheral interconnect layer 222. Array interconnect layer 223 can include bit line contacts 226, word line vias 257, one or more conductor layers 271 in dielectric layer 259. The conductor layers 271 can include conductor materials including, but not limited to, W, Co, Cu, Al, silicides, or any combination thereof. Each bit line contact 226 can contact the lower end of a corresponding NAND string 230 to individually address corresponding NAND string 230. Each word line via 257 can contact the lower end of a corresponding word line contact 258 to individually address a corresponding word line 234 of NAND strings 230.

A bonding interface 219 can be formed between dielectric layer 210 of peripheral interconnect layer 222 and dielectric layer 259 of array interconnect layer 223. Conductor plugs 273 can be joined at bonding interface 219 to electrically interconnect conductor layer 271 of array interconnect layer 223 and conductor layer 216 of peripheral interconnect layer 222. As such, NAND strings 230 and word lines 234 can be electrically connected to one or more peripheral devices.

In some embodiments, a first semiconductor structure 260 is bonded to a second semiconductor structure 262 at bonding interface 219. First semiconductor structure 260 can include substrate 202, one or more peripheral devices on substrate 202, and peripheral interconnect layer 222. Second semiconductor structure 262 can include semiconductor layer 244 (e.g., a thinned substrate), array interconnect layer 223, alternating conductor/dielectric stack 242 having a plurality of conductor/dielectric layer pairs, and NAND strings 230. First semiconductor structure 260 can include the elements shown below bonding interface 219 in FIG. 1, while second semiconductor structure 262 can include the elements shown above bonding interface 219 in FIG. 1.

As shown in FIG. 1, 3D memory device 100 can include a pad 280 and a pad opening 282 exposing a surface of pad 280. The 3D memory device 100 can be connected with an external device through pad 280. The signals receiving from the external device can be transmitted to the one or more peripheral devices in second semiconductor structure 262 through pad 280. In some embodiments, pad 280 can include conductor materials including, but not limited to, W, Co, Cu, Al, silicides, or any combination thereof. In one example, pad 280 is an aluminum pad.

In some embodiments, pad 280 can be embedded in peripheral interconnect layer 222, as shown in FIG. 1. In some embodiments, by embedded in peripheral interconnect layer 222, both top and bottom surfaces of pad 280 are located between the top and bottom surfaces of peripheral interconnect layer 222. Pad 280 can be connected to transistor 206 through one or more contacts 207 and/or conductor layers 216 in peripheral interconnect layer 222. Pad opening 282 can be located at a side edge of alternating conductor/dielectric stack 242 and close to the staircase structure region. In some embodiments, pad opening 282 can extend through the entire first semiconductor structure 260 including semiconductor layer 244 and dielectric layer 259, and can extend into a portion of dielectric layer 210 in second semiconductor structure 262. In some embodiments, a thickness of pad 280 can be in a range from about 0.1 µm to about 3 µm.

It is noted that, pad 280 can be formed either before or after bonding first semiconductor structure 260 to second semiconductor structure 262. The two types of fabricating method for forming pad 280 and pad opening 282 are described in detail below in connection with FIGS. 2 and 3.

Figure 2:
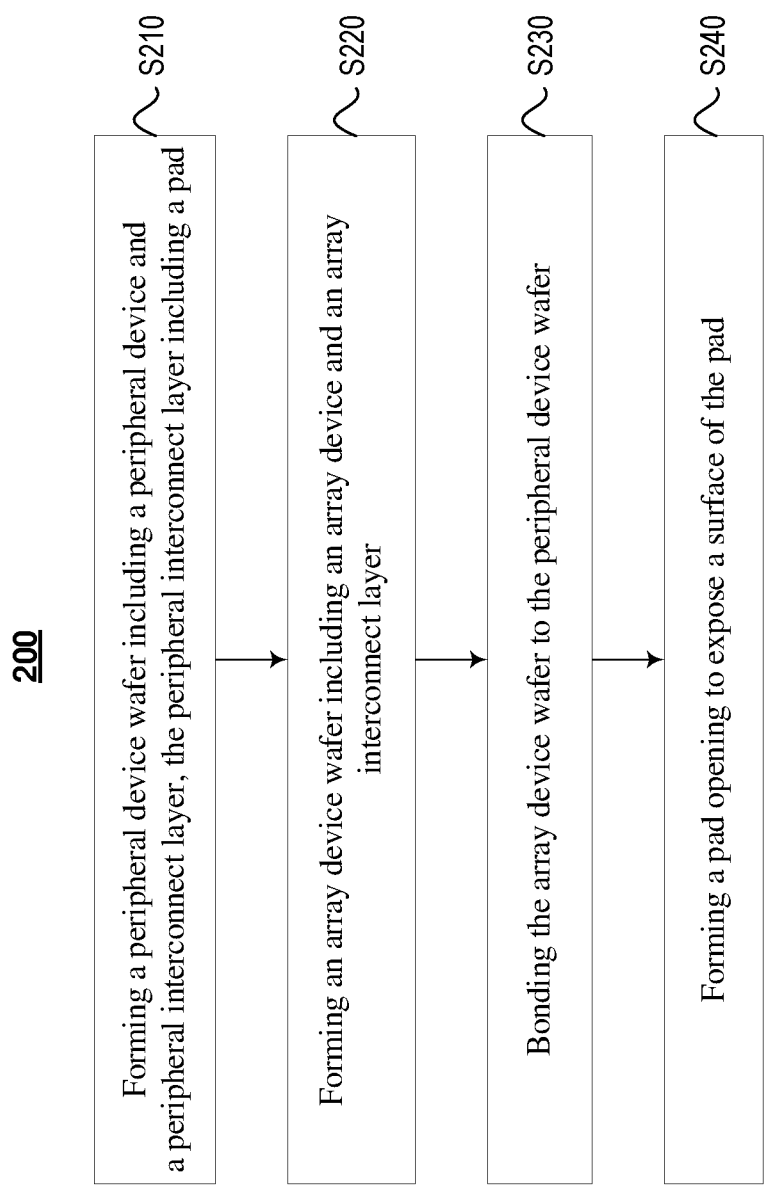
FIG. 2 illustrates an exemplary fabrication process for forming a 3D memory device as shown in FIG. 1 in accordance with some embodiments of the present disclosure.

Referring to FIG. 2, an exemplary fabrication process 200 for forming a 3D memory device as shown in FIG. 1 is illustrated in accordance with some embodiments. It should be understood that the operations shown in fabrication process 200 are not exhaustive and that other operations can be performed as well before, after, or between any of the illustrated operations.

As shown in FIG. 2, fabrication process 200 starts at operation S210, in which a peripheral device wafer including a peripheral device and a peripheral interconnect layer is formed. One or more pads can be formed in the peripheral interconnect layer. An example of the peripheral device wafer is second semiconductor structure 262 as depicted in FIG. 1. The peripheral wafer can include one or more peripheral devices (e.g., transistors 206) on a substrate (e.g., substrate 202), one or more peripheral interconnect structures (e.g., one or more contacts 207 and/or conductor layers 216) and one or more pads (e.g., pad 280) in one or more dielectric layers (e.g., dielectric layer 210).

In some embodiments, fabricating operations for forming the peripheral device wafer can include forming a peripheral device is formed on a first substrate. The first substrate can be a silicon substrate. The peripheral device can include a plurality of transistors formed on the first substrate. Transistors (e.g., transistors 206) can be formed by a plurality of processing steps including, but not limited to, photolithography, dry/wet etch, thin film deposition, thermal growth, implantation, CMP, or any combination thereof. In some embodiments, doped regions can be formed in the first substrate, which function, for example, as source regions and/or drain regions of transistors.

In some embodiments, fabricating operations for forming the peripheral device wafer can further include forming a peripheral interconnect layer including one or more peripheral interconnect structures and one or more pads. In some embodiments, the peripheral interconnect layer can include one or more dielectric layers and conductor layers formed above the peripheral device. Each of the dielectric layers and conductor layers can be a portion of the peripheral interconnect layer that transfers electrical signals to and from the peripheral device.

In some embodiments, fabricating operations for forming the peripheral interconnect layer can include forming one or more dielectric layers, one or more conductor layers and/or contacts in the one or more dielectric layers. The one or more contacts can include MEOL contacts to (e.g., contacts 207, conductor plugs 273) make electrical connections with the peripheral device. The conductor layers (e.g., conductor layers 216) and contact layers (e.g., contact 207) can include conductor materials deposited by one or more thin film deposition processes including, but not limited to, CVD, PVD, ALD, electroplating, electroless plating, or any combination thereof. Fabrication processes to form the conductor layers and contact layers can also include photolithography, CMP, wet/dry etch, or any combination thereof. The one or more dielectric layers (e.g., dielectric layer 210) can include dielectric materials deposited by one or more thin film deposition processes including, but not limited to, CVD, PVD, ALD, or any combination thereof.

In some embodiments, fabricating operations for forming the peripheral interconnect layer can further include forming one or more pads. The one or more pads can be formed in a same layer in the dielectric layer (e.g., dielectric layer 210), and can include conductor materials deposited by one or more thin film deposition processes including, but not limited to, CVD, PVD, ALD, electroplating, electroless plating, or any combination thereof. Fabrication processes to form the one or more pads can also include photolithography, CMP, wet/dry etch, or any combination thereof. In some embodiments, the one or more pads can be Al pads. In some embodiments, a thickness of the one or more pads can be in a range from about 0.1 µm to about 3 µm.

As shown in FIG. 2, fabrication process 200 proceeds to operation S220, in which an array device wafer including an array device and an array interconnect layer is formed then thinned. An example of the thinned array device wafer is first semiconductor structure 260 as depicted in FIG. 1. The array device can include multiple NAND strings 230 and a staircase structure. The array interconnect layer can include one or more array interconnect structures (e.g., one or more contacts 226, 257, 258, and/or conductor layers 271) in one or more dielectric layers (e.g., dielectric layer 259).

In some embodiments, fabricating operations for forming the array device wafer can include forming a plurality of dielectric layer pairs (also referred to herein as an "alternating dielectric stack") are formed on a second substrate (e.g., semiconductor layer 244). The plurality of dielectric pairs can form an alternating dielectric stack including an alternating stack of a first dielectric layer 236 and a second dielectric layer (not shown in figures) that is different from first dielectric layer 236. In some embodiments, each dielectric layer pair includes a layer of silicon nitride and a layer of silicon oxide. In some embodiments, there are more layers than the dielectric layer pairs made of different materials and with different thicknesses in alternating dielectric stack. Alternating dielectric stack can be formed by one or more thin film deposition processes including, but not limited to, CVD, PVD, ALD, or any combination thereof.

In some embodiments, fabricating operations for forming the array device wafer can further include transforming the alternating dielectric stack to an alternating conductor/dielectric stack. The second dielectric layers are used as sacrificial layers that are removed and replaced with conductor layers 234. As such, alternating dielectric stack can be converted to alternating conductor/dielectric stack 242 including a plurality of conductor/dielectric layer pairs, i.e., an alternating stack of a conductor layer (e.g., polysilicon, tungsten, etc.) and a dielectric layer (e.g., silicon oxide). The replacement of the second dielectric layers with conductor layers 234 can be performed by wet etching the second dielectric layers selective to first dielectric layers 236 and filling the structure with conductor layers 234. Conductor layers 234 can be filled by CVD, ALD, any other suitable process, or any combination thereof. Conductor layers 416 can include conductor materials including, but not limited to, W, Co, Cu, Al, polysilicon, silicides, or any combination thereof.

In some embodiments, fabricating operations for forming the array device wafer can further include forming a plurality of NAND strings 230 penetrating alternating conductor/dielectric stack 242. In some embodiments, fabrication processes to form NAND strings 230 can include forming a semiconductor channel 228 that extends vertically through alternating conductor/dielectric stack 242. In some embodiments, semiconductor channel 228 can be an amorphous silicon layer or a polysilicon layer formed by using a thin film deposition process, such as a low pressure chemical vapor deposition (LPCVD) process; plasma enhanced chemical vapor deposition (PECVD) process, Atomic Layer Deposition (ALD) or any other suitable processes.

In some embodiments, fabrication processes to form NAND strings 230 can further include forming a dielectric layer 229 between semiconductor channel 228 and the plurality of conductor/dielectric layer pairs in alternating conductor/dielectric stack 242. Dielectric layer 229 can be a composite dielectric layer, such as a combination of multiple dielectric layers including, but not limited to, a blocking layer, a storage layer, and a tunneling layer.

The blocking layer can be used for blocking the outflow of the electronic charges. In some embodiments, the blocking layer can be a silicon oxide layer or a combination of silicon oxide/silicon oxynitride/silicon oxide ($SiO_2$—SiON—$SiO_2$) multi-layer stack. In some embodiments, the blocking layer includes high dielectric constant (high-k) dielectrics (e.g., aluminum oxide). In one example, the blocking layer includes a silicon oxide layer formed by In-Situ Steam Generation (ISSG) oxidation after a silicon nitride deposition process.

The storage layer can be used for storing electronic charges. The storage and/or removal of charges in the storage layer 8 can impact the on/off state and/or a conductance of the semiconductor channel. The storage layer can include polycrystalline silicon (polysilicon) or silicon nitride. The storage layer can include one or more films of materials including, but are not limited to, silicon nitride, silicon oxynitride, a combination of silicon oxide and silicon nitride, or any combination thereof. In some embodiments, the storage layer can include a nitride layer formed by using one or more deposition processes.

The tunneling layer can be used for tunneling electronic charges (electrons or holes). The tunneling layer can be dielectric materials including, but not limited to, silicon oxide, silicon nitride, silicon oxynitride, or any combination thereof. In some embodiments, the tunneling layer can be an oxide layer formed by using a deposition process.

In some embodiments, fabrication processes to form NAND strings 230 can further include forming an epitaxial layer 251 at an end of NAND string 230. In some embodiments, epitaxial layer 251 can be formed in the second substrate (e.g., semiconductor layer 244), and correspond to each NAND string 230 as an epitaxial plug 251. Epitaxial layer 251 can be a silicon layer in contact with and epitaxially grown from the second substrate (e.g., semiconductor layer 244) and can be implanted to a desired doping level.

In some embodiments, fabricating operations for forming the array device wafer can further include forming a staircase structure in a side edge of the alternating conductor/dielectric stack. In some embodiments, before converting the alternating dielectric stack to the alternating conductor/dielectric stack, portions of the alternating dielectric stack can be removed to form a staircase structure at the side edge of alternating dielectric stack. For example, multiple etch-trim processes can be performed repeatedly to form a set of steps of the staircase structure.

In some embodiments, fabricating operations for forming the array device wafer can further include forming multiple word line contacts. As illustrated in FIG. 1, each word line contact 258 can extend vertically through dielectric layer 259. In some embodiments, an end of word line contact 258 lands on a word line of NAND strings 230 (e.g., a conductor layer 234) at one step of the staircase structure, such that each word line contact 425 is electrically connected to a corresponding conductor layer 416. Each word line contact 258 can be electrically connected to a corresponding conductor layer 234 to individually address a corresponding word line of NAND strings 230.

In some embodiments, fabrication processes to form word line contacts 258 include forming a vertical opening through dielectric layer 259 using dry/wet etch process, followed by filling the opening with conductor materials and other materials (e.g., a barrier layer, an adhesion layer, and/or a seed layer) for conductor filling, adhesion, and/or other purposes. Word line contacts 258 can include conductor materials including, but not limited to, W, Co, Cu, Al, doped silicon, silicides, or any combination thereof. The openings of word line contacts 258 can be filled with conductor materials and other materials by ALD, CVD, PVD, electroplating, any other suitable processes, or any combination thereof.

In some embodiments, fabricating operations for forming the array device wafer can further include forming an array interconnect layer on the plurality of NAND strings. The array interconnect layer can transfer electrical signals between the NAND strings and other parts of the 3D memory devices, such as the peripheral device. As shown in FIG. 1, in some embodiments, the array interconnect layer 223 can include one or more array interconnect structures (e.g., one or more contacts 226, 257, 258, one or more conductor plugs 273, and/or conductor layers 271) in one or more dielectric layers (e.g., dielectric layer 259).

In some embodiments, fabrication processes to form array interconnect layer 223 include forming a dielectric layer 259, followed by forming a plurality of bit line contacts 226 in contact with NAND strings 230 in dielectric layer 259. Dielectric layer 259 can include one or more layers of dielectric materials such as silicon oxide, silicon nitride, silicon oxynitride, or any combination thereof. Bit line contacts 226 can be formed by forming openings in dielectric layer 259, followed by filling the openings with conductor materials and dielectric materials. Bit line contact 226 can include conductor materials including, but not limited to, W, Co, Cu, Al, doped silicon, silicides, or any combination thereof. The openings of bit line contact 226 can be filled with conductor materials and dielectric materials by ALD, CVD, PVD, any other suitable processes, or any combination thereof.

In some embodiments, fabrication processes to form array interconnect layer 223 further include forming a plurality of word line vias 257 in dielectric layer 259. Each word line via 257 can contact an end of a corresponding word line contact 258 to enable electrical connections. Word line vias 257 can be formed by forming openings in dielectric layer 259, followed by filling the openings with conductor materials. Other materials, such as barrier materials and/or seed layer materials, can also be used to partially fill the openings before filling the conductor materials to enhance the adhesion or filling performance of the conductor materials. Word line vias 257 can include conductor materials including, but not limited to, W, Co, Cu, Al, doped silicon, silicides, or any combination thereof. The openings of word line vias 257 can be filled with conductor materials and barrier materials by ALD, CVD, PVD, electroplating, any other suitable processes, or any combination thereof.

In some embodiments, fabrication processes to form array interconnect layer 223 further include forming one or more conductor layers (e.g., conductor layers 271) and one or more contact layers (e.g., conductor plugs 273) in dielectric layer 259. Conductor layers and contact layers can include conductor materials including, but not limited to, W, Co, Cu, Al, doped silicon, silicides, or any combination thereof.

Conductor layers and contact layers can be formed by any suitable known BEOL methods.

Referring to FIG. 2, fabrication process 200 proceeds to operation S230, in which the array device wafer is bonded to the peripheral device wafer. In some embodiments, the array device wafer can be flipped upside down and positioned above the peripheral device wafer. The array interconnect layer of the array device wafer can be aligned with and then bonded with the peripheral interconnect layer of the peripheral device wafer.

As shown in FIG. 1, in some embodiments, aligning array interconnect layer 223 with peripheral interconnect layer 222 is performed by aligning conductor plugs 273 of array interconnect layer 223 with corresponding conductor plugs 273 of peripheral interconnect layer 222. As a result, corresponding conductor plugs 273 can be connected at bonding interface 219 when the array device is joined with the peripheral device.

In some embodiments, the array device is joined with the peripheral device by flip-chip bonding the first and second substrates. In some embodiments, the array interconnect layer and the peripheral interconnect layer are joined by hybrid bonding of the first substrate and the second substrate in a face-to-face manner, such that the array interconnect layer 223 is above and in contact with the peripheral interconnect layer 222 in the resulting 3D memory device. Hybrid bonding (also known as "metal/dielectric hybrid bonding") can be a direct bonding technology (e.g., forming bonding between surfaces without using intermediate layers, such as solder or adhesives), which obtains metal-metal bonding and dielectric-dielectric bonding simultaneously. As illustrated in FIG. 1, array interconnect layer 223 can be joined with peripheral interconnect layer 222, thereby forming a bonding interface 219.

In some embodiments, a treatment process can be used to enhance the bonding strength between array interconnect layer 223 and peripheral interconnect layer 222 before or during the joining process of the two interconnect layers. In some embodiments, each of dielectric layer 210 and dielectric layer 259 includes silicon oxide or silicon nitride. In some embodiments, the treatment process can include a plasma treatment that treats the surfaces of array interconnect layer 223 and peripheral interconnect layer 222 so that the surfaces of the two interconnect layers form chemical bonds between dielectric layer 210 and dielectric layer 259. In some embodiments, the treatment process can include a wet process that treats the surfaces of array interconnect layer 223 and peripheral interconnect layer 222 so that the surfaces of the two interconnect layers form preferable chemical bonds to enhance the bonding strength between two dielectric layers 223 and 222. In some embodiments, the treatment process can include a thermal process that can be performed at a temperature from about 250° C. to about 600° C. The thermal process can cause inter-diffusion between conductor plugs 273 in array interconnect layer 223 and peripheral interconnect layer 222. As a result, corresponding pairs of conductor plugs 273 can be inter-mixed with each other after the joining process.

In some embodiments, the second substrate can be thinned so that the thinned second substrate serves as a semiconductor layer 244 above the array device (e.g., the NAND strings 230). In some embodiments, thinning the second substrate can comprise one or more of grinding, dry etching, wet etching, and chemical mechanical polishing (CMP) the second substrate.

Referring to FIG. 2, fabrication process 200 proceeds to operation S240, in which a pad opening can be formed to expose a surface of the pad. As shown in FIG. 1, a portion of semiconductor layer 244 and dielectric layers 210, 259 can be removed to form a pad opening 282. As such, pad opening 282 can extend through the semiconductor layer 244 and dielectric layer 259, and extend into a portion of dielectric layer 210 to expose a surface of pad 280. Pad opening 282 can be located at a side edge of alternating conductor/dielectric stack 242 and close to the staircase structure region. Pad opening 282 can be formed by a plurality of processing steps including, but not limited to, photolithography, dry/wet etch, cleaning, etc.

Figure 3:
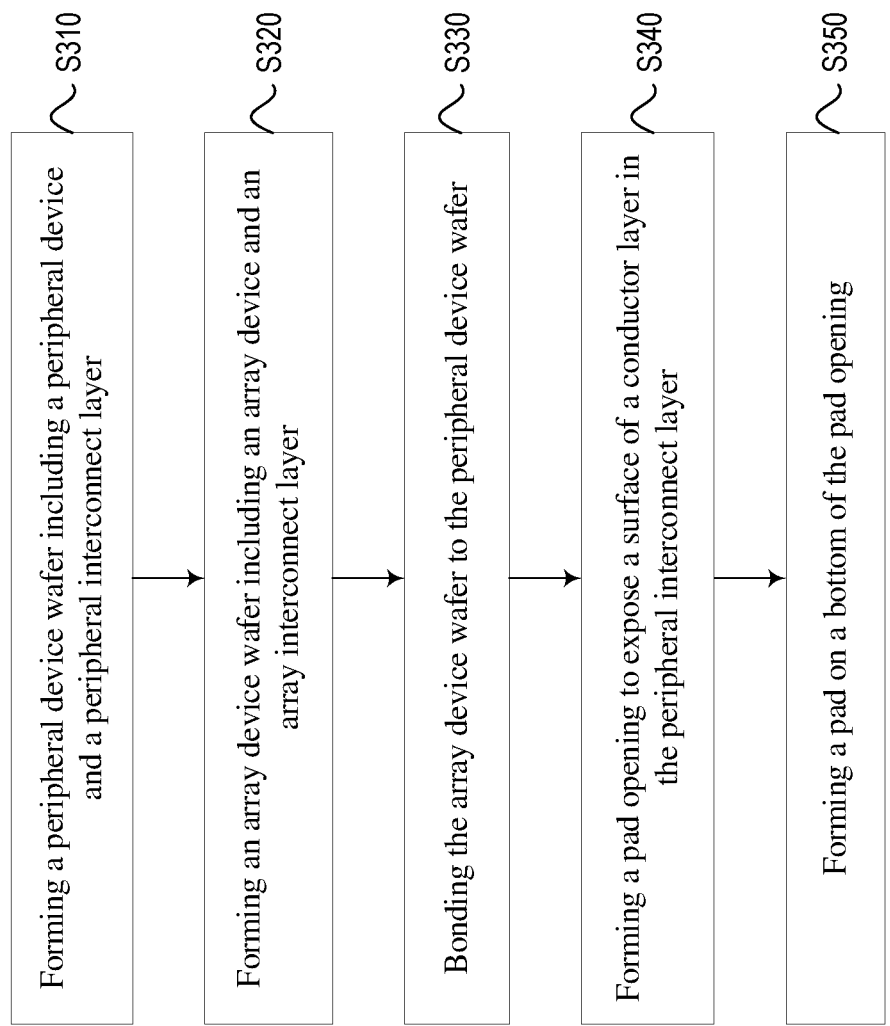
FIG. 3 illustrates another exemplary fabrication process for forming a 3D memory device as shown in FIG. 1 is illustrated in accordance with some other embodiments of the present disclosure.

Referring to FIG. 3, another exemplary fabrication process 300 for forming a 3D memory device as shown in FIG. 1 is illustrated in accordance with some other embodiments. It should be understood that the operations shown in fabrication process 300 are not exhaustive and that other operations can be performed as well before, after, or between any of the illustrated operations.

As shown in FIG. 3, fabrication process 300 starts at operation S310, in which a peripheral device wafer including a peripheral device and a peripheral interconnect layer is formed. It is noted that, comparing to operation S210 described above, operation S310 does not include forming one or more pad in the peripheral interconnect layer. Other details of operation S310 can be referred to operation S210 described above in connection with FIG. 2.

Fabrication process 300 proceeds to operation S320, in which an array device wafer including an array device and an array interconnect layer is formed then thinned. Details of operation S320 can be referred to operation S220 described above in connection with FIG. 2.

Fabrication process 300 proceeds to operation S330, in which the array device wafer is bonded to the peripheral device wafer. Details of operation S330 can be referred to operation S230 described above in connection with FIG. 2.

Fabrication process 300 proceeds to operation S340, in which a pad opening can be formed to penetrate the array interconnect layer and extend into the peripheral interconnect layer. As shown in FIG. 1, a portion of semiconductor layer 244 and dielectric layers 210, 259 can be removed to form a pad opening 282. As such, pad opening 282 can extend through the semiconductor layer 244 and dielectric layer 259, and extend into a portion of dielectric layer 210 to expose a surface of a conductor layer in peripheral interconnect layer 222. Pad opening 282 can be located at a side edge of alternating conductor/dielectric stack 242 and close to the staircase structure region. Pad opening 282 can be formed by a plurality of processing steps including, but not limited to, photolithography, dry/wet etch, cleaning, etc.

Fabrication process 300 proceeds to operation S350, in which a pad can be formed on a bottom of the pad opening. As shown in FIG. 1, pad 280 can be formed in dielectric layer 210 at the bottom of pad opening 282 and in contact with a conductor layer 216. Pad 280 can include conductor materials deposited by one or more thin film deposition processes including, but not limited to, CVD, PVD, ALD, electroplating, electroless plating, or any combination thereof. Fabrication processes to form the one or more pads can also include photolithography, CMP, wet/dry etch, or any combination thereof. In some embodiments, pad 280 can be an Al pad. In some embodiments, a thickness of pad 280 can be in a range from about 0.1 μm to about 3 μm.

Figure 4:
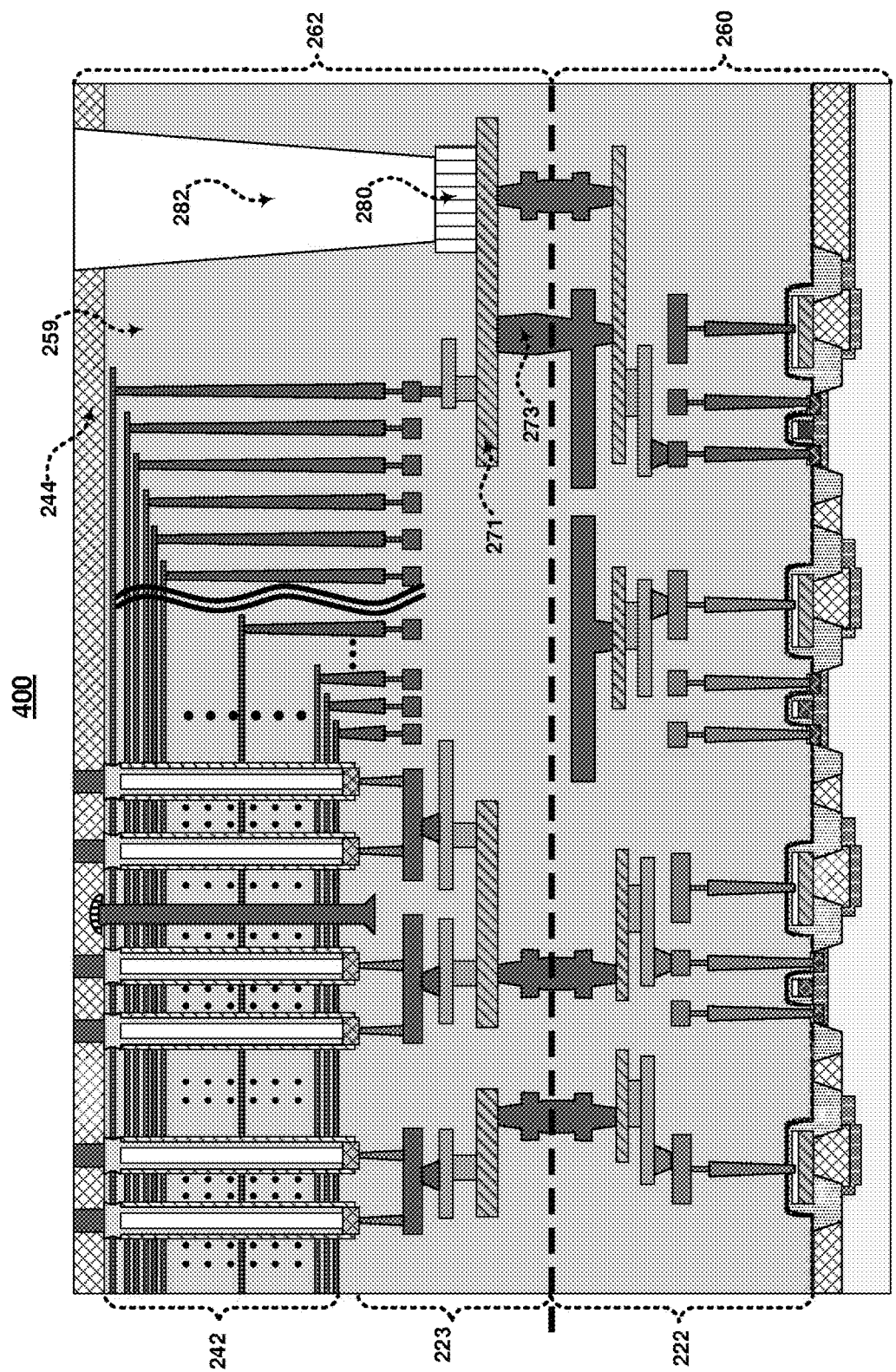
FIGS. 4 and 5 illustrate cross-section of other exemplary 3D memory according to some other embodiments of the present disclosure.
Figure 5:
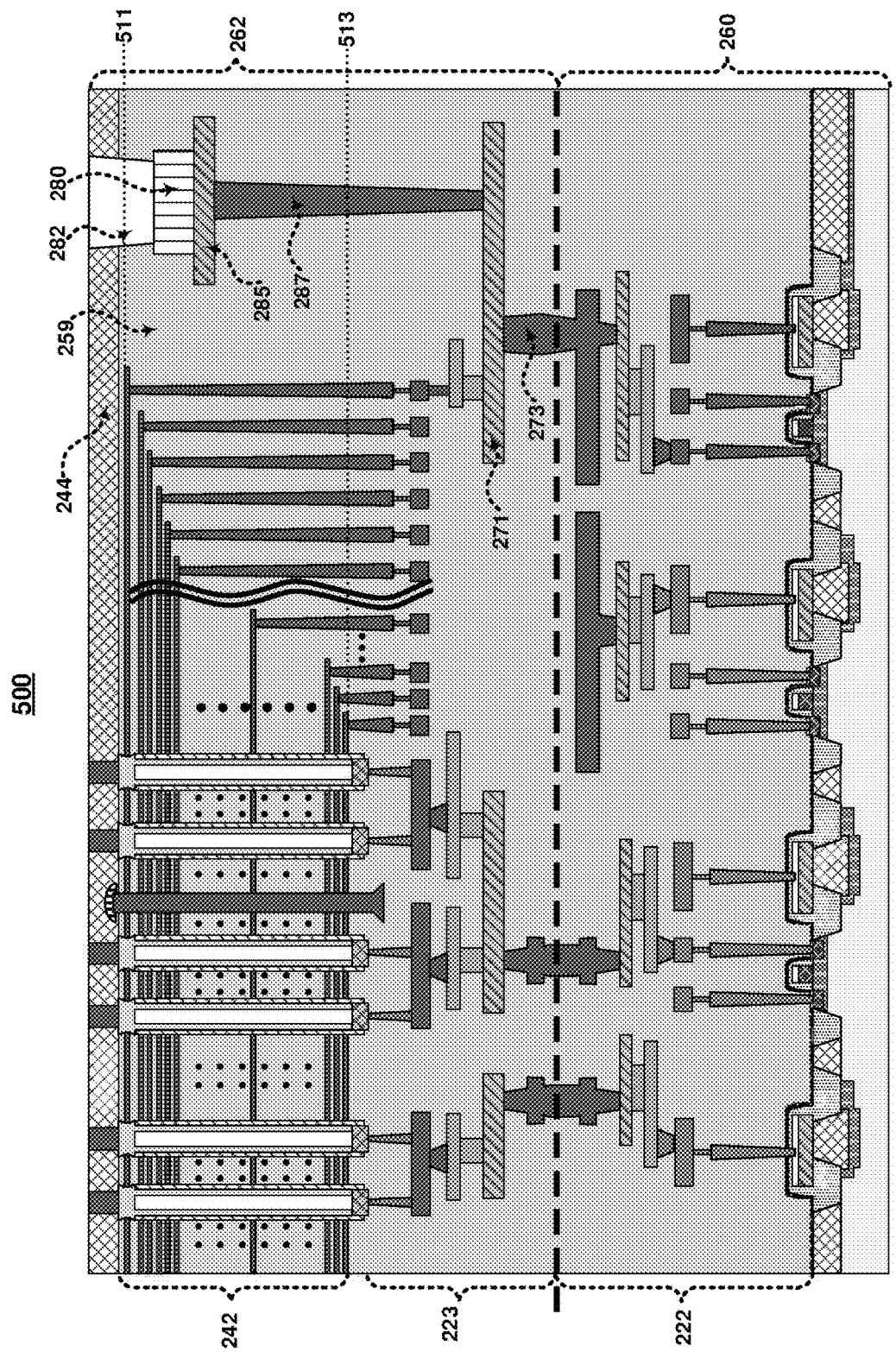

FIGS. 4 and 5 illustrate cross-section of exemplary 3D memory devices 400 and 500 according to some other embodiments of the present disclosure. Comparing to 3D memory devices 100 as shown in FIG. 1, one or more pad 280 in 3D memory devices 400 are not located in peripheral interconnect layer 222 but in array interconnect layer 223. Each pad can be in contact with a conductor layer 271 in array interconnect layer 223. In some embodiments, a thickness of pad 280 can be in a range from about 0.1 μm to about 3 μm.

In some embodiments, as shown in FIG. 4, in y-direction, pad 280 can be embedded in array interconnect layer 223 and below a bottom surface of alternating conductor/dielectric stack 242. Pad 280 can be electronically connected to the peripheral device through conductor layer 271 and conductor plug 273 in array interconnect layer 223. In some other embodiments, as shown in FIG. 5, in y-direction, pad 280 can be embedded in dielectric layer 259. That is, pad 280 is sandwiched between a first lateral surface 511 coplanar with a top surface of the alternating conductor/dielectric stack 242 and a second lateral surface 513 coplanar with a bottom surface of alternating conductor/dielectric stack 242. Pad 280 can be electronically connected to the peripheral device through conductor layer 285 and conductor plug 287 in dielectric layer 259 above array interconnect layer 223, as well as conductor layer 271 and conductor plug 273 in array interconnect layer 223.

Pad opening 282 can be located at a side edge of alternating conductor/dielectric stack 242 and close to the staircase structure region. In some embodiments, pad opening 282 can extend through the semiconductor layer 244, and can extend into a portion of dielectric layer 259. In some embodiments, as shown in FIG. 4, a depth of pad opening 282 can be larger than a thickness of alternating conductor/dielectric stack 242. In some other embodiments, as shown in FIG. 5, a depth of pad opening 282 can be less than a thickness of alternating conductor/dielectric stack 242.

It is noted that, pad 280 can be formed either before or after bonding first semiconductor structure 260 to second semiconductor structure 262. The two types of fabricating method for forming pad 280 and pad opening 282 are described in detail below in connection with FIGS. 6 and 7.

Figure 6:
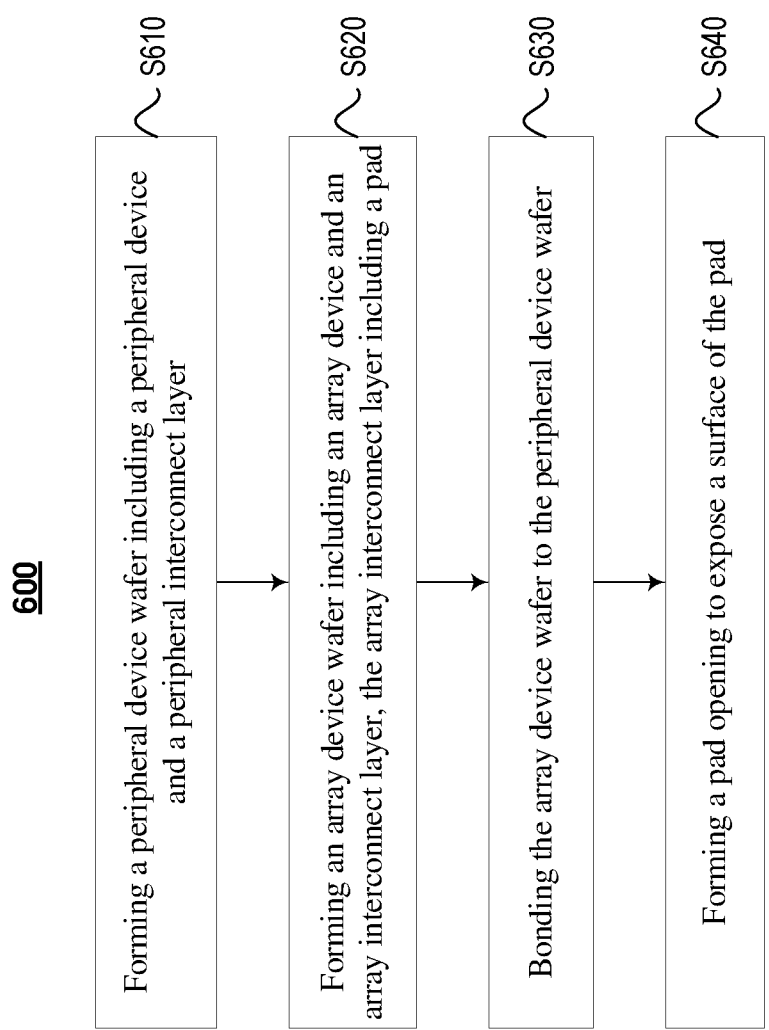
FIG. 6 illustrates an exemplary fabrication process for forming a 3D memory device as shown in FIG. 4 or FIG. 5 in accordance with some embodiments of the present disclosure.

Referring to FIG. 6, an exemplary fabrication process 600 for forming a 3D memory device as shown in FIG. 4 or FIG. 5 is illustrated in accordance with some embodiments. It should be understood that the operations shown in fabrication process 600 are not exhaustive and that other operations can be performed as well before, after, or between any of the illustrated operations.

As shown in FIG. 6, fabrication process 600 starts at operation S610, in which a peripheral device wafer including a peripheral device and a peripheral interconnect layer is formed. It is noted that, comparing to operation S210 described above, operation S610 does not include forming one or more pad in the peripheral interconnect layer. Other details of operation S610 can be referred to operation S210 described above in connection with FIG. 2.

Fabrication process 600 proceeds to operation S620, in which an array device wafer including an array device and an array interconnect layer is formed then thinned. Comparing to operation S220 described above, operation S620 further include forming a pad in the array device wafer. Pad 280 can include conductor materials deposited by one or more thin film deposition processes including, but not limited to, CVD, PVD, ALD, electroplating, electroless plating, or any combination thereof. Fabrication processes to form the one or more pads can also include photolithography, CMP, wet/dry etch, or any combination thereof. In some embodiments, pad 280 can be an Al pad.

In some embodiments, as shown in FIG. 4, in y-direction, pad 280 can be formed in array interconnect layer 223 and below the bottom surface of alternating conductor/dielectric stack 242. Pad 280 can be formed in contact with conductor layer 271 that is connected to a shallow conductor plug 273. A depth of shallow conductor plug 273 is less than a thickness of array interconnect layer 223.

In some other embodiments, as shown in FIG. 5, in y-direction, pad 280 can be formed in dielectric layer 259 and above the bottom surface of alternating conductor/dielectric stack 242. Pad 280 can be formed in contact with conductor layer 285 that is connected to a deep conductor plug 287. A depth of deep conductor plug 287 is larger than a thickness of array interconnect layer 223.

In some embodiments, a thickness of pad 280 can be in a range from about 0.1 μm to about 3 μm. Other details of operation S620 can be referred to operation S220 described above in connection with FIG. 2.

Fabrication process 600 proceeds to operation S630, in which the array device wafer is bonded to the peripheral device wafer. Details of operation S630 can be referred to operation S230 described above in connection with FIG. 2.

Fabrication process 600 proceeds to operation S640, in which a pad opening can be formed to expose the pad. As shown in FIGS. 4 and 5, a portion of semiconductor layer 244 and dielectric layer 259 can be removed to form a pad opening 282. As such, pad opening 282 can extend through the semiconductor layer 244, and extend into a portion of dielectric layer 259 to expose pad 280. Pad opening 282 can be located at a side edge of alternating conductor/dielectric stack 242 and close to the staircase structure region. Pad opening 282 can be formed by a plurality of processing steps including, but not limited to, photolithography, dry/wet etch, cleaning, etc.

In some embodiments as shown in FIG. 4, when pad 280 is formed in array interconnect layer 223 and below the bottom surface of alternating conductor/dielectric stack 242, a depth of pad opening 282 is larger than a thickness of alternating conductor/dielectric stack 242. In some other embodiments as shown in FIG. 5, when pad 280 is formed in dielectric layer 259 and above the bottom surface of alternating conductor/dielectric stack 242, a depth of pad opening 282 is less than a thickness of alternating conductor/dielectric stack 242.

Figure 7:
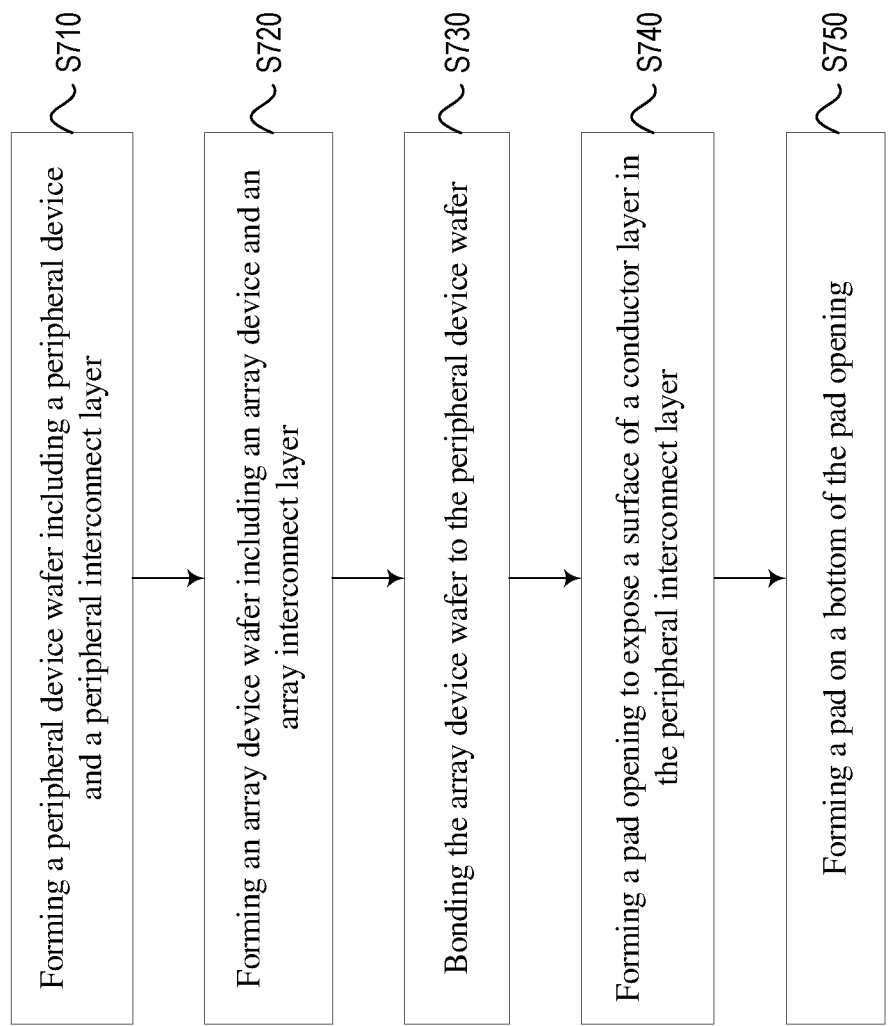
FIG. 7 illustrates another exemplary fabrication process for forming a 3D memory device as shown in FIG. 4 or FIG. 5 in accordance with some embodiments of the present disclosure.

Referring to FIG. 7, another exemplary fabrication process 700 for forming a 3D memory device as shown in FIG. 4 or FIG. 5 is illustrated in accordance with some embodiments. It should be understood that the operations shown in fabrication process 700 are not exhaustive and that other operations can be performed as well before, after, or between any of the illustrated operations.

As shown in FIG. 7, fabrication process 700 starts at operation S710, in which a peripheral device wafer including a peripheral device and a peripheral interconnect layer is formed. It is noted that, comparing to operation S210 described above, operation S710 does not include forming one or more pad in the peripheral interconnect layer. Other details of operation S710 can be referred to operation S210 described above in connection with FIG. 2.

Fabrication process 700 proceeds to operation S720, in which an array device wafer including an array device and an array interconnect layer is formed then thinned. Details of operation S720 can be referred to operation S220 described above in connection with FIG. 2.

Fabrication process 700 proceeds to operation S730, in which the array device wafer is bonded to the peripheral device wafer. Details of operation S730 can be referred to operation S230 described above in connection with FIG. 2.

Fabrication process 700 proceeds to operation S740, in which a pad opening can be formed to expose a surface of a conductor layer. As shown in FIGS. 4 and 5, a portion of semiconductor layer 244 and dielectric layer 259 can be removed to form a pad opening 282. As such, pad opening 282 can extend through the semiconductor layer 244, and extend into a portion of dielectric layer 259. Pad opening 282 can be located at a side edge of alternating conductor/dielectric stack 242 and close to the staircase structure region. Pad opening 282 can be formed by a plurality of processing steps including, but not limited to, photolithography, dry/wet etch, cleaning, etc.

In some embodiments as shown in FIG. 4, when pad opening 282 can be a deep opening that exposes a surface of a conductor later 271 in array interconnect layer 223. A depth of pad opening 282 is larger than a thickness of alternating conductor/dielectric stack 242. In some other embodiments as shown in FIG. 5, when pad opening 282 can be a shallow opening that exposes a surface of a conductor later 285 in dielectric layer 259 above array interconnect layer 223. A depth of pad opening 282 is less than a thickness of alternating conductor/dielectric stack 242.

Fabrication process 700 proceeds to operation S750, in which a pad can be formed on a bottom of the pad opening. In some embodiments as shown in FIG. 4, pad 280 can be formed in array interconnect layer 223 and below the bottom surface of alternating conductor/dielectric stack 242. In some other embodiments as shown in FIG. 5, pad 280 can be formed in dielectric layer 259 and above the bottom surface of alternating conductor/dielectric stack 242. Pad 280 can include conductor materials deposited by one or more thin film deposition processes including, but not limited to, CVD, PVD, ALD, electroplating, electroless plating, or any combination thereof. Fabrication processes to form the one or more pads can also include photolithography, CMP, wet/dry etch, or any combination thereof. In some embodiments, pad 280 can be an Al pad. In some embodiments, a thickness of pad 280 can be in a range from about 0.1 μm to about 3 μm.

Figure 8:
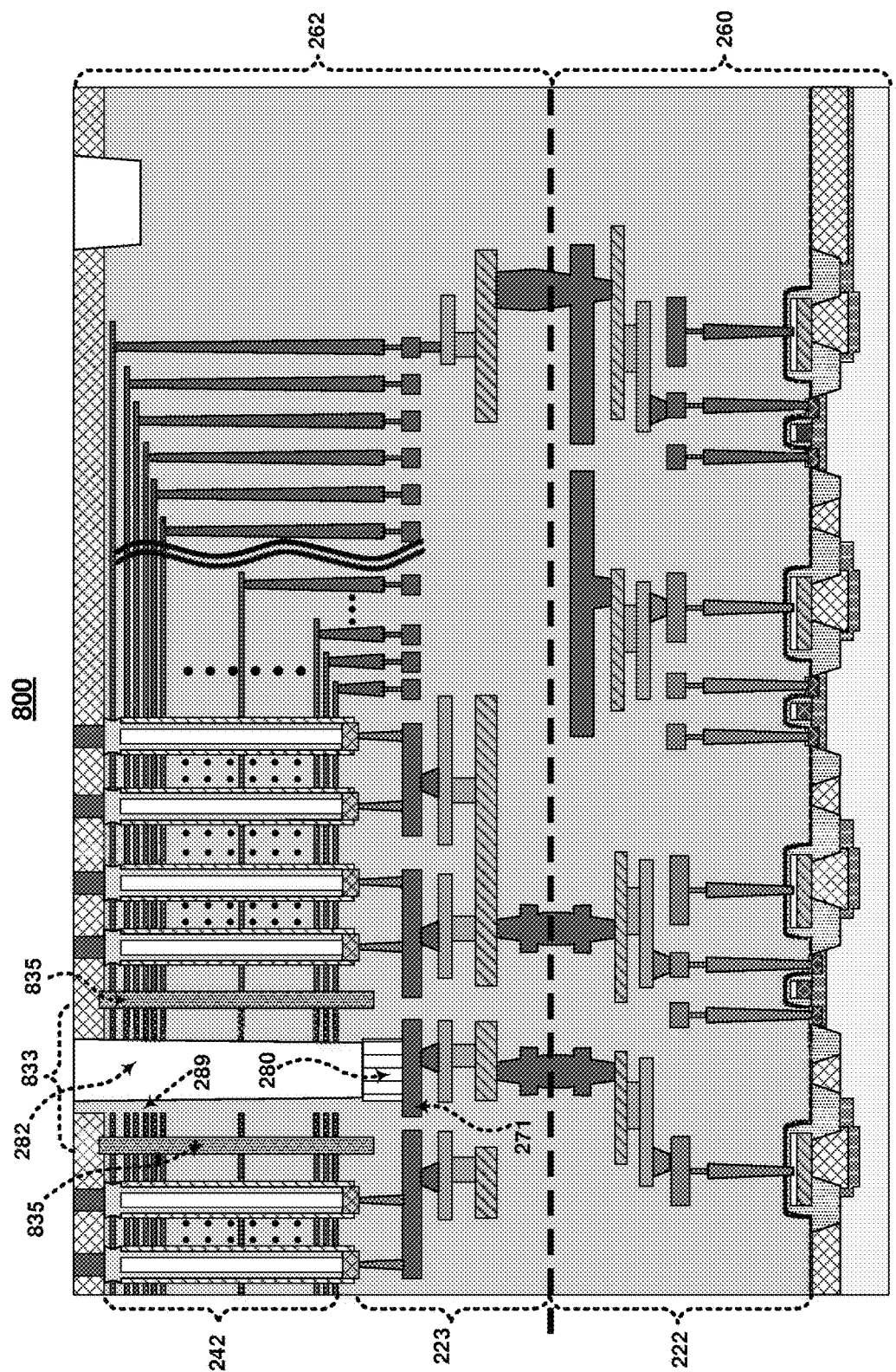
FIG. 8 illustrates cross-section of an exemplary 3D memory device according to some other embodiments of the present disclosure.

FIG. 8 illustrates cross-section of an exemplary 3D memory device 800 according to some other embodiments of the present disclosure. Comparing to 3D memory devices 400 as shown in FIG. 4, one or more pad openings 282 in 3D memory devices 400 are not located at a side edge of alternating conductor/dielectric stack 242 and close to the staircase structure region but penetrate through alternating conductor/dielectric stack 242.

In some embodiments, as shown in FIG. 8, in y-direction, pad 280 can be embedded in array interconnect layer 223 and underneath alternating conductor/dielectric stack 242. Pad 280 can be electronically connected to the peripheral device through conductor layer 271 and conductor plug 273 in array interconnect layer 223. In x-direction, pad 280 can be located in an array region and underneath alternating conductor/dielectric stack 242.

Pad opening 282 can extend through entire semiconductor layer 244 and alternating conductor/dielectric stack 242, and extend into a portion of dielectric layer 259. In some embodiments, sidewalls of pad opening 282 (e.g., right sidewall of pad opening 282 as shown in FIG. 8) are one or more dielectric layers. For example, before converting the alternating dielectric stack to alternating conductor/dielectric stack 242, a through array contact (TAC) region 833 can be defined by a barrier structure 835 penetrating the alternating dielectric stack. The second dielectric layers in the alternating dielectric stack outside the TAC region can be replaced with conductor layers 234, while the second dielectric layers in the alternating dielectric stack within the TAC region remains the same. Pad opening 282 can be formed in the TAC region to ensure that sidewalls of pad opening 282 (e.g., right sidewall of pad opening 282 as shown in FIG. 8)) are multiple dielectric layers (e.g., first and second dielectric layers). As another example, after forming alternating conductor/dielectric stack 242, a through array opening can be formed to penetrate alternating conductor/dielectric stack 242. A dielectric structure 289 can be filled into the through array opening. Pad opening 282 can be formed in the dielectric structure 289 to ensure that sidewalls of pad opening 282 (e.g., left sidewall of pad opening 282 as shown in FIG. 8) are one or more dielectric layers (e.g., dielectric structure 289).

It is noted that, pad 280 can be formed either before or after bonding first semiconductor structure 260 to second semiconductor structure 262. The two types of fabricating method for forming pad 280 and pad opening 282 are described in detail below in connection with FIGS. 9 and 10.

Figure 9:
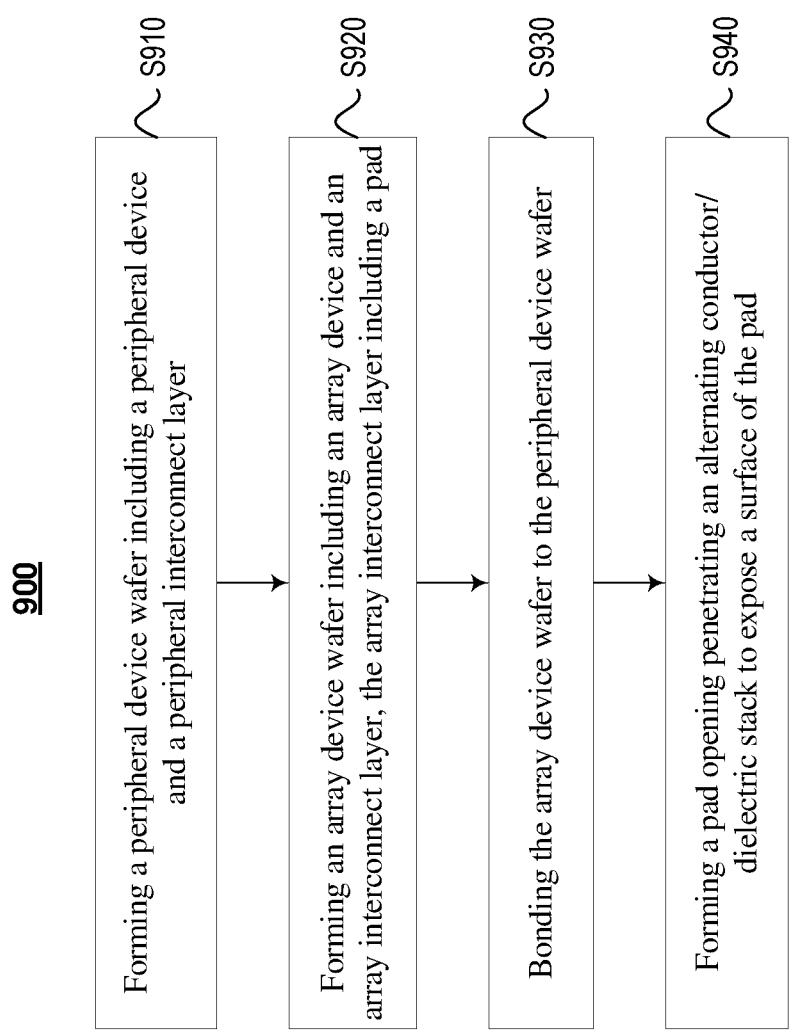
FIG. 9 illustrates an exemplary fabrication process for forming a 3D memory device as shown in FIG. 8 in accordance with some embodiments of the present disclosure.

Referring to FIG. 9, an exemplary fabrication process 900 for forming a 3D memory device as shown in FIG. 8 is illustrated in accordance with some embodiments. It should be understood that the operations shown in fabrication process 900 are not exhaustive and that other operations can be performed as well before, after, or between any of the illustrated operations.

As shown in FIG. 9, fabrication process 900 starts at operation S910, in which a peripheral device wafer including a peripheral device and a peripheral interconnect layer is formed. It is noted that, comparing to operation S210 described above, operation S910 does not include forming one or more pad in the peripheral interconnect layer. Other details of operation S910 can be referred to operation S210 described above in connection with FIG. 2.

Fabrication process 900 proceeds to operation S920, in which an array device wafer including an array device and an array interconnect layer is formed then thinned. Comparing to operation S220 described above, operation S620 further include forming a pad in the array device wafer. Pad 280 can include conductor materials deposited by one or more thin film deposition processes including, but not limited to, CVD, PVD, ALD, electroplating, electroless plating, or any combination thereof. Fabrication processes to form the one or more pads can also include photolithography, CMP, wet/dry etch, or any combination thereof. In some embodiments, pad 280 can be an Al pad.

In some embodiments, as shown in FIG. 8, in y-direction, pad 280 can be formed in array interconnect layer 223 and below the bottom surface of alternating conductor/dielectric stack 242. Pad 280 can be formed in contact with conductor layer 271. In some embodiments, a thickness of pad 280 can be in a range from about 0.1 μm to about 3 μm.

In some embodiments, operation S920 further includes forming a dielectric structure penetrating semiconductor layer 244 and alternating conductor/dielectric stack 242, and corresponding to pad 280. For example, before converting the alternating dielectric stack to alternating conductor/dielectric stack 242, a through array contact (TAC) region can be defined by a barrier structure (not shown in figures) penetrating the alternating dielectric stack. The second dielectric layers in the alternating dielectric stack outside the TAC region can be replaced with conductor layers 234, while the second dielectric layers in the alternating dielectric stack within the TAC region remains the same. As such, the alternating dielectric stack within the TAC region forms the dielectric structure. As another example, after forming alternating conductor/dielectric stack 242, a through array opening can be formed to penetrate alternating conductor/dielectric stack 242. The dielectric structure can be formed to fill the through array opening.

Other details of operation S920 can be referred to operation S220 described above in connection with FIG. 2.

Fabrication process 900 proceeds to operation S930, in which the array device wafer is bonded to the peripheral device wafer. Details of operation S930 can be referred to operation S230 described above in connection with FIG. 2.

Fabrication process 900 proceeds to operation S940, in which a pad opening can be formed to expose the pad. As shown in FIG. 8, a portion of semiconductor layer 244 and the dielectric structure formed in operation S920 can be removed to form a pad opening 282. As such, pad opening 282 can extend through the semiconductor layer 244 and alternating conductor/dielectric stack 242 to expose pad 280.

In some embodiments, sidewalls 289 of pad opening 282 are one or more dielectric layers. For example, a through array contact (TAC) region can be defined by a barrier structure (not shown in figures) penetrating alternating conductor/dielectric stack 242. Sidewalls 289 of pad opening 282 are multiple dielectric layers (e.g., first and second dielectric layers). As another example, a dielectric structure penetrates alternating conductor/dielectric stack 242, and sidewalls 289 of pad opening 282 is the dielectric structure.

Referring to FIG. 10, another exemplary fabrication process 1000 for forming a 3D memory device as shown in FIG. 8 is illustrated in accordance with some embodiments. It should be understood that the operations shown in fabrication process 1000 are not exhaustive and that other operations can be performed as well before, after, or between any of the illustrated operations.

As shown in FIG. 10, fabrication process 1000 starts at operation S1010, in which a peripheral device wafer including a peripheral device and a peripheral interconnect layer is formed. It is noted that, comparing to operation S210 described above, operation S1010 does not include forming one or more pad in the peripheral interconnect layer. Other details of operation S1010 can be referred to operation S210 described above in connection with FIG. 2.

Fabrication process 1000 proceeds to operation S1020, in which an array device wafer including an array device and an array interconnect layer is formed then thinned. Comparing to operation S220 described above, operation S920 further includes forming a dielectric structure penetrating semiconductor layer 244 and alternating conductor/dielectric stack 242. For example, before converting the alternating dielectric stack to alternating conductor/dielectric stack 242, a through array contact (TAC) region can be defined by a barrier structure (not shown in figures) penetrating the alternating dielectric stack. The second dielectric layers in the alternating dielectric stack outside the TAC region can be replaced with conductor layers 234, while the second dielectric layers in the alternating dielectric stack within the TAC region remains the same. As such, the alternating dielectric stack within the TAC region forms the dielectric structure. As another example, after forming alternating conductor/dielectric stack 242, a through array opening can be formed to penetrate alternating conductor/dielectric stack 242. The dielectric structure can be formed to fill the through array opening. Other details of operation S1020 can be referred to operation S220 described above in connection with FIG. 2.

Fabrication process 1000 proceeds to operation S1030, in which the array device wafer is bonded to the peripheral device wafer. Details of operation S1030 can be referred to operation S230 described above in connection with FIG. 2.

Fabrication process 1000 proceeds to operation S1040, in which a pad opening can be formed in the dielectric structure to expose a surface of a conductor layer. As shown in FIG. 8, a portion of semiconductor layer 244 and the dielectric structure formed in operation S1020 can be removed to form a pad opening 282. As such, pad opening 282 can extend through the semiconductor layer 244 and alternating conductor/dielectric stack 242 to expose a top surface of conductor layer 271.

In some embodiments, sidewalls 289 of pad opening 282 are one or more dielectric layers. For example, a through array contact (TAC) region can be defined by a barrier structure (not shown in figures) penetrating alternating conductor/dielectric stack 242. That is, the TAC region is isolated from the alternating conductor/dielectric stack by a barrier structure. Sidewalls 289 of pad opening 282 are multiple dielectric layers (e.g., first and second dielectric layers). As another example, a dielectric structure penetrates alternating conductor/dielectric stack 242, and sidewalls 289 of pad opening 282 is the dielectric structure.

Fabrication process 1000 proceeds to operation S1050, in which a pad can be formed on a bottom of the pad opening. In some embodiments as shown in FIG. 8, pad 280 can be formed in array interconnect layer 223 and below the bottom surface of alternating conductor/dielectric stack 242. Pad 280 can be in contact with conductor layer 271. Pad 280 can include conductor materials deposited by one or more thin film deposition processes including, but not limited to, CVD, PVD, ALD, electroplating, electroless plating, or any combination thereof. Fabrication processes to form the one or more pads can also include photolithography, CMP, wet/dry etch, or any combination thereof. In some embodiments, pad 280 can be an Al pad. In some embodiments, a thickness of pad 280 can be in a range from about 0.1 μm to about 3 μm.

Accordingly, various embodiments in accordance with the present disclosure provide fabricating methods and corresponding formed 3D memory devices with smaller die size, higher device density, and improved performance compared with other 3D memory devices. By embedding one or more pads into a peripheral device wafer or an array device wafer, a distance between one or more pads and the peripheral circuit in the peripheral device wafer is shorten. As such, the resistance and capacitance between the pads and the peripheral device can be significantly reduced, thereby increasing accuracy of signal transmission through the one or more pads.

One aspect of the present disclosure provides a 3D memory device comprising an array device semiconductor structure comprising: an alternating conductor/dielectric stack disposed on a semiconductor layer, and an array interconnect layer disposed on the alternating conductor/dielectric stack and including at least one first interconnect structure. The 3D memory device further comprises a peripheral device semiconductor structure comprising: at least one peripheral device disposed on a substrate, and a peripheral interconnect layer disposed on the at least one peripheral device and including at least one second interconnect structure; at least one pad embedded in the array device semiconductor structure or the peripheral interconnect layer. The 3D memory device further comprises a pad opening exposing a surface of the at least one pad. The array interconnect layer is bonded with the peripheral interconnect layer, and the at least one pad is electrically connected with at least one peripheral device through the at least one first interconnect structure or the at least one second interconnect structure.

In some embodiments, the at least one pad is embedded in the peripheral interconnect layer; the pad opening extends through the array device semiconductor structure and extends into the peripheral interconnect layer; and the at least one pad is electrically connected with the at least one peripheral device through at least one second interconnect structure.

In some embodiments, the at least one pad is embedded in the array interconnect layer; a depth of the pad opening is larger than a thickness of the alternating conductor/dielectric stack; and the at least one pad is electrically connected with at least one peripheral device through the at least one first interconnect structure and the at least one second interconnect structure.

In some embodiments, the at least one pad is embedded in a dielectric layer and is sandwiched between a first lateral surface coplanar with a top surface of the alternating conductor/dielectric stack and a second lateral surface coplanar with a bottom surface of the alternating conductor/dielectric stack; a depth of the pad opening is less than a thickness of the alternating conductor/dielectric stack; and the at least one pad is electrically connected with at least one peripheral device through at least one pad interconnect structure in the dielectric layer, the at least one first interconnect structure, and the at least one second interconnect structure.

In some embodiments, the at least one pad is located at a side edge of the alternating conductor/dielectric stack and close to a staircase structure region.

In some embodiments, the at least one pad is located in a dielectric layer in the array interconnect layer; and the pad opening extends through the alternating conductor/dielectric stack.

In some embodiments, the at least one pad is located in a dielectric structure that extends through the alternating conductor/dielectric stack.

In some embodiments, the dielectric structure is isolated from the alternating conductor/dielectric stack by a barrier structure.

Another aspect of the present disclosure provides a method for forming a 3D memory device, comprising: forming an array device semiconductor structure comprising: an alternating conductor/dielectric stack disposed on a semiconductor layer, and an array interconnect layer disposed on the alternating conductor/dielectric stack and including at least one first interconnect structure; forming a peripheral device semiconductor structure comprising: at least one peripheral device disposed on a substrate, and a peripheral interconnect layer disposed on the at least one peripheral device and including at least one second interconnect structure and at least one pad, the at least one pad being electrically connected with the at least one peripheral device through the at least one second interconnect structure; bonding the array interconnect layer to the peripheral interconnect layer, such that the at least one first interconnect structure is joined with the at least one second interconnect structure; and forming a pad opening exposing a surface of the at least one pad.

In some embodiments, the method further comprises: before bonding the array interconnect layer to the peripheral interconnect layer, forming the at least one pad in the peripheral interconnect layer and in contact with the at least one second interconnect structure; and after bonding the array interconnect layer to the peripheral interconnect layer, forming the pad opening penetrating the array device semiconductor structure and extending into the peripheral interconnect layer to expose a surface of the at least one pad.

Another aspect of the present disclosure provides a method for forming a 3D memory device, comprising: forming an array device semiconductor structure comprising: an alternating conductor/dielectric stack disposed on a semiconductor layer, and an array interconnect layer disposed on the alternating conductor/dielectric stack and including at least one first interconnect structure and at least one pad; forming a peripheral device semiconductor structure comprising: at least one peripheral device disposed on a substrate, and a peripheral interconnect layer disposed on the at least one peripheral device and including at least one second interconnect structure; bonding the array interconnect layer to the peripheral interconnect layer, such that the at least one first interconnect structure is joined with the at least one second interconnect structure, and the at least one pad is electrically connected with the at least one peripheral device through the at least one of first interconnect structure and the at least one second interconnect structure; and forming a pad opening exposing a surface of the at least one pad.

In some embodiments, the method further comprises: before bonding the array interconnect layer to the peripheral interconnect layer, forming the at least one pad in the array interconnect layer and in contact with the at least one first interconnect structure; and after bonding the array interconnect layer to the peripheral interconnect layer, forming the pad opening penetrating the semiconductor layer and extending into the array interconnect layer to expose a surface of the at least one pad.

In some embodiments, the method further comprises: before bonding the array interconnect layer to the peripheral interconnect layer, forming a barrier structure to form a through array contact region in the array device semiconductor; and after bonding the array interconnect layer to the peripheral interconnect layer, forming the pad opening penetrating the through array contact region and extending into the array interconnect layer.

In some embodiments, the method further comprises: before bonding the array interconnect layer to the peripheral interconnect layer, forming a dielectric structure penetrating the alternating conductor/dielectric stack; and after bonding the array interconnect layer to the peripheral interconnect layer, forming the pad opening penetrating the dielectric structure region and extending into the array interconnect layer.

In some embodiments, the method further comprises: forming the pad opening at a side edge of the alternating conductor/dielectric stack and close to a staircase structure region of the alternating conductor/dielectric stack.

Another aspect of the present disclosure provides a method for forming a 3D memory device, comprising: forming an array device semiconductor structure comprising: an alternating conductor/dielectric stack disposed on a semiconductor layer, an array interconnect layer disposed on the alternating conductor/dielectric stack and including at least one first interconnect structure; forming a peripheral device semiconductor structure, the peripheral device semiconductor structure comprising: at least one peripheral device disposed on a substrate, and a peripheral interconnect layer disposed on the at least one peripheral devices and including at least one second interconnect structure; bonding the array interconnect layer to the peripheral interconnect layer, such that at least one first interconnect structure is joined with at least one second interconnect structure; forming a pad opening exposing a surface of the at least one first interconnect structure or a surface of the at least one second interconnect structure; and forming a pad at a bottom of the pad, such that the pad is electrically connected to the at least one peripheral device through the at least one first interconnect structure or the at least one second interconnect structure.

In some embodiments, the method further comprises: after bonding the array interconnect layer to the peripheral interconnect layer, forming the pad opening penetrating the array device semiconductor structure and extending into the peripheral interconnect layer to expose a surface of the at least one second interconnect structure; and forming the pad at a bottom of the pad opening in the peripheral interconnect layer and in contact with the at least one second interconnect structure.

In some embodiments, the method further comprises: after bonding the array interconnect layer to the peripheral interconnect layer, forming the pad opening penetrating the semiconductor layer and extending into the array interconnect layer to expose a surface of the at least one first interconnect structure; and forming the pad at a bottom of the pad opening in the array interconnect layer and in contact with the at least one first interconnect structure.

In some embodiments, the method further comprises: before bonding the array interconnect layer to the peripheral interconnect layer, forming a barrier structure to form a through array contact region array device semiconductor; and after bonding the array interconnect layer to the peripheral interconnect layer, forming the pad opening penetrating the through array contact region and extending into the array interconnect layer to expose a surface of the at least one first interconnect structure; and forming the pad at a bottom of the pad opening in the array interconnect layer and in contact with the at least one first interconnect structure.

In some embodiments, the method further comprises: before bonding the array interconnect layer to the peripheral interconnect layer, forming a dielectric structure penetrating the alternating conductor/dielectric stack; after bonding the array interconnect layer to the peripheral interconnect layer, forming the pad opening penetrating the dielectric structure region and extending into the array interconnect layer to expose a surface of the at least one first interconnect structure; and forming the pad at a bottom of the pad opening in the array interconnect layer and in contact with the at least one first interconnect structure.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A 3D memory device, comprising:
    an array device semiconductor structure comprising:
        an alternating conductor/dielectric stack disposed on a semiconductor layer, and
        an array interconnect layer disposed on the alternating conductor/dielectric stack and including at least one first interconnect structure;
    a peripheral device semiconductor structure comprising:
        at least one peripheral device disposed on a substrate, and
        a peripheral interconnect layer disposed on the at least one peripheral device and including at least one second interconnect structure;
    at least one pad embedded in the array device semiconductor structure or the peripheral interconnect layer; and
    a pad opening exposing a surface of the at least one pad;
    wherein the array interconnect layer is bonded with the peripheral interconnect layer, and the at least one pad is electrically connected with the at least one peripheral device through the at least one first interconnect structure or the at least one second interconnect structure.

2. The device of claim 1, wherein:
    the at least one pad is embedded in the peripheral interconnect layer;
    the pad opening extends through the array device semiconductor structure and extends into the peripheral interconnect layer; and
    the at least one pad is electrically connected with the at least one peripheral device through at least one second interconnect structure.

3. The device of claim 1, wherein:
    the at least one pad is embedded in the array interconnect layer;
    a depth of the pad opening is larger than a thickness of the alternating conductor/dielectric stack; and
    the at least one pad is electrically connected with at least one peripheral device through the at least one first interconnect structure and the at least one second interconnect structure.

4. The device of claim 1, wherein:
    the at least one pad is embedded in a dielectric layer and is sandwiched between a first lateral surface coplanar with a top surface of the alternating conductor/dielectric stack and a second lateral surface coplanar with a bottom surface of the alternating conductor/dielectric stack;
    a depth of the pad opening is less than a thickness of the alternating conductor/dielectric stack; and
    the at least one pad is electrically connected with at least one peripheral device through at least one pad interconnect structure in the dielectric layer, the at least one first interconnect structure, and the at least one second interconnect structure.

5. The device of claim 3, wherein the at least one pad is located at a side edge of the alternating conductor/dielectric stack and close to a staircase structure region.

6. The device of claim 3, wherein:
the at least one pad is located in a dielectric layer in the array interconnect layer; and
the pad opening extends through the alternating conductor/dielectric stack.

7. The device of claim 6, wherein:
the at least one pad is located in a dielectric structure that extends through the alternating conductor/dielectric stack.

8. The device of claim 7, wherein:
the dielectric structure is isolated from the alternating conductor/dielectric stack by a barrier structure.

\* \* \* \* \*